United States Patent [19]

Wu et al.

[11] Patent Number: 5,270,294

[45] Date of Patent: Dec. 14, 1993

[54] FREE-STANDING OXIDE SUPERCONDUCTING ARTICLES

[75] Inventors: Xin D. Wu, Greenbelt, Md.; Ross E. Muenchausen, Espanola, N. Mex.

[73] Assignee: The United States of America as represented by the United States Department of Energy, Washington, D.C.

[21] Appl. No.: 813,727

[22] Filed: Dec. 27, 1991

[51] Int. Cl.$^5$ .......................................... H01L 39/00

[52] U.S. Cl. ...................................... 505/1; 505/701; 427/62; 428/702; 428/930

[58] Field of Search .................... 505/1, 780, 701; 252/521; 501/152; 427/62, 63, 419.3; 423/604, 635; 428/702, 930

[56] References Cited

U.S. PATENT DOCUMENTS

| | | | |
|---|---|---|---|
| 5,086,037 | 2/1982 | Hitotsuyanagi et al. | 505/1 |
| 5,087,605 | 2/1992 | Hegde et al. | 505/1 |

FOREIGN PATENT DOCUMENTS

0298866A2  1/1989  European Pat. Off. .

OTHER PUBLICATIONS

Ginley et al, "Freestanding Thick Films of YBa$_2$Cu$_3$O$_{6.9}$ by Screenprinting Technique", J. Mater. Res. vol. 4, No. 3, May/Jun. 1989 pp. 501–503.

T. Inoue et al., "Epitaxial Growth of CeO$_2$ Layers on Silicon," Applied Physics Letters 56 (14), pp. 1332–1333, Apr. 2, 1990.

H. Nagata et al., "Heteroepitaxial Growth of CeO$_2$ (001) Films on Si (001) Substrates by Pulsed Laser Deposition in Ultrahigh Vacuum," Japanese Journal of Applied Physics, 30 (6B), L1136–L1138, Jun. 1991.

C. T. Rogers et al., "Fabrication of Heteroepitaxial YBa$_2$Cu$_3$O$_{7-x}$–PrBa$_2$Cu$_3$O$_{7-x}$–YBa$_2$Cu$_3$O$_{7-x}$ Josephson Devices Grown by Laser Deposition," Applied Physics Letters 55 (19), pp. 2032–2033, Nov. 6, 1990.

J. J. Kingston et al., "Multilayer YBa$_2$Cu$_3$O$_x$–SrTiO$_3$–YBa$_2$Cu$_3$O$_x$ Films for Insulating Crossovers," Applied Physics Letters 56 (2), pp. 189–191, Jan. 8, 1990.

A. B. Berezin et al., "Y$_1$Ba$_2$Cu$_3$O$_{7-x}$ Thin Films Grown on Sapphire with Epitaxial MgO Buffer Layers," Applied Physics Letters 57 (1), pp. 90–92, Jul. 2, 1990.

D. K. Fork et al., "High Critical Currents in Strained Epitaxial YBa$_2$Cu$_3$O$_{7-d}$ on Si," Applied Physics Letters 57 (11), pp. 1161–1163, Sep. 10, 1990.

X. D. Wu et al., "Epitaxial Yttria-Stabilized Zirconia on (1101) Sapphire for YB$_2$Cu$_3$O$_{7-d}$ Thin Films," Applied Physics Letters 58 (3), pp. 304–306, Jan. 21, 1991.

H. Myoren et al., "Crystalline Qualities and Critical Current Densities of As-Grown Ba$_2$YCu$_3$O$_x$ Thin Films on Silicon with Buffer Layers," Japanese Journal of Applied Physics, vol. 29, No. 6, L955–L957, Jun. 1990.

M. Yoshimoto et al., "In Situ RHEED Observation of CeO$_2$ Film Growth on Si by Laser Ablation Deposition in Ultrahigh-Vacuum," Japanese Journal of Applied Physics, vol. 29, No. 7, L1199–L1202, Jul. 1990.

X. D. Wu et al., "Epitaxial CeO$_2$ Films as Buffer Layers for High-Temperature Superconducting Thin Films," Applied Physics Letters 58, (19), pp. 2165–2167, May 13, 1991.

H. K. Ng et al., "Possible Enhancement in Bolometric Response Using Free-Standing Film of YBa$_2$Cu$_3$O$_x$," SPIE, vol. 1477, Superconductivity Applications for Infrared and Microwave Devises 11, pp. 15–19, (1991).

K. M. Beauchamp et al., "Barrier Technology for Dysprosium Barium Copper Oxide (DyBa$_2$Cu$_3$O$_{7-x}$) Junctions and Related Structures," Chem. Abst. 114, (20): 197437Z (1991).

*Primary Examiner*—Roy King
*Attorney, Agent, or Firm*—Bruce H. Cottrell; Paul D. Gaetjens; William R. Moser

[57] ABSTRACT

A substrate-free, free-standing epitaxially oriented superconductive film including a layer of a template material and a layer of a ceramic superconducting material is provided together with a method of making such a substrate-free ceramic superconductive film by coating an etchable material with a template layer, coating the template layer with a layer of a ceramic superconductive material, coating the layer of ceramic superconductive material with a protective material, removing the etchable material by an appropriate means so that the etchable material is separated from a composite structure including the template layer, the ceramic superconductive material layer and the protective material layer, removing the protective material layer from the composite structure whereby a substrate-free, free-standing ceramic superconductive film remains.

5 Claims, No Drawings

FREE-STANDING OXIDE SUPERCONDUCTING ARTICLES

This invention is the result of a contract with the Department of Energy (Contract No. W-7405-ENG-36).

FIELD OF THE INVENTION

The present invention relates to the field of free-standing superconducting articles, e.g., films and other bulk forms, and to a process of preparing such free-standing superconducting articles.

BACKGROUND OF THE INVENTION

Free-standing superconducting films formed of, e.g., yttrium-barium-copper oxide ($YBa_2Cu_3O_{7-x}$), have application for optical and infrared detection. For best applications, the superconductive material should be epitaxial since sharp superconducting transitions are needed.

Free-standing superconductive films have been previously prepared by deposition of the selected superconductive material onto a heated carbon substrate. See, e.g., Ng et al., SPIE, Vol. 1477, Superconductivity Applications for Infrared and Microwave Devices II, pg. 15–19 (1991). As carbon is an amorphous material, it was not possible to obtain epitaxial superconductive material in this manner.

Another form of a free-standing superconductive article would be a bulk form such as a microwave cavity or a current-carrying plate that is, e.g., pressed from superconductive powder into the desired shape. Such a bulk form of pressed superconductive material would be suseptible to attack by, e.g., moisture, or suseptible to atmospheric degradation. The protection of such an article by a thin layer of a protective or passivating material would be desirable.

Accordingly, an object of the invention is to provide an essentially substrate-free, free-standing superconductive film including a layer of a template material such as $CeO_2$ and a layer of an epitaxially oriented superconductive material such as yttrium-barium-copper oxide.

Another object of the invention is to provide a method of preparing such an essentially substrate-free, free-standing epitaxially oriented superconductive film.

Still another object of the invention is a method of protecting a free-standing superconductive article that is, e.g., a bulk form such as a microwave cavity of pressed superconductive material, by coating the superconductive article with a layer of an inorganic protective material such as $CeO_2$.

SUMMARY OF THE INVENTION

To achieve the foregoing and other objects, and in accordance with the purposes of the present invention, as embodied and broadly described herein, the present invention provides a substrate-free superconductive film comprising a layer of a template material, and, a layer of epitaxially oriented ceramic high temperature superconducting material adjacent the layer of template material, said article further characterized as having a ratio of the superconducting material thickness to the template material thickness of from about 1:10 to about 100:1. Preferably, the template material can be selected from among cerium oxide, curium oxide, dysprosium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, yttrium oxide, ytterbium oxide, yttria-stabilized zirconium oxide, magnesium oxide, strontium-titanium oxide, barium-titanium oxide, barium-zirconium oxide, and magnesium-aluminum oxide, more preferably from among cerium oxide, gadolinium oxide, yttrium oxide, praseodymium oxide, dysprosium oxide, yttria-stabilized zirconium oxide, magnesium oxide, strontium-titanium oxide, barium-titanium oxide, barium-zirconium oxide, and magnesium-aluminum oxide.

The present invention further provides a method of making a substrate-free ceramic high temperature superconductive film comprising coating a substrate with an etchable material, coating the etchable layer with a template layer, coating the template layer with a layer of a ceramic high temperature superconductive material, coating the layer of ceramic high temperature superconductive material with a protective material, removing the etchable material by an appropriate means so that the substrate is separated from a composite structure including the template layer, the ceramic high temperature superconductive material layer and the protective material layer, removing the protective material layer from the composite structure whereby a free-standing substrate-free ceramic high temperature superconductive film remains. Optionally, an etchable substrate such as a single crystal quartz can be used in place of the substrate coated with an etchable material.

DETAILED DESCRIPTION

The present invention concerns free-standing films of epitaxially oriented high temperature ceramic superconductive materials useful for optical and infrared detectors.

The free-standing film of the present invention include a layer of a template material and a layer of an epitaxially oriented ceramic high temperature superconductive material. The template layer is of sufficiently small dimensions, i.e., thickness, whereby the free-standing article performs as a detector as if the template layer is not present. The dimensions, i.e., thickness, of the superconductive layer dominate the performance of the article. Generally, the ratio of the superconducting material layer thickness to the template layer thickness is at least 1:10, preferably at least 5:1, more preferably at least 10:1, and most preferably at least 100:1.

By the term "free-standing" is meant that the article is not supported on a bulk substrate, i.e., on a substrate that greatly dominates in the ratio of materials. By the term "film" is generally meant a thin layer of material generally from about 100 angstroms to about 10 microns.

The template layer is essential in the preparation of the free-standing film as the template layer permits the formation of the epitaxially oriented superconductive material. During the formation of the free-standing film the template layer will be an intermediate layer between an etchable material and the superconductive material. Typically, the thickness of the template layer during preparation of the film can be from about 100 angstroms to about 10 microns, preferably from about 1000 angstroms to about 2000 angstroms.

The free-standing films of the present invention can be prepared by first coating an etchable substrate with a layer of a template material. The etchable substrate can be a material itself directly etchable or can be another material initially coated with a layer of an etchable material. The etchable substrate can be, e.g., quartz. Optionally, a substrate can be initially coated with an etchable material, the composite article then to serve as the etchable or removable substrate. For example, cerium oxide can be coated onto a substrate of yttria-stabilized zirconia and eventually the cerium oxide can be etched off with hydrofluoric acid (HF).

The materials used as the template layer are both structurally and chemically compatibility with an overcoat layer of a ceramic high temperature superconductive material. By "chemical compatibility" is meant that the template layer does not undergo property-degrading chemical interactions with the superconductive material. By "structural compatibility" is meant that the template layer has a substantially similar lattice structure with the superconductive material thereby allowing for the deposition of epitaxially oriented superconductive material. Among the suitable template layer materials are included cerium oxide ($CeO_2$), curium oxide ($Cm_2O_3$), dysprosium oxide ($Dy_2O_3$), erbium oxide ($Er_2O_3$), europium oxide ($Eu_2O_3$), iron oxide (beta-$Fe_2O_3$), gadolinium oxide ($Gd_2O_3$), holmium oxide ($Ho_2O_3$), indium oxide ($In_2O_3$), lanthanum oxide ($La_2O_3$), manganese oxide (beta-$Mn_2O_3$), lutetium oxide ($Lu_2O_3$), neodymium oxide ($Nd_2O_3$), praseodymium oxide ($Pr_2O_3$), plutonium oxide ($Pu_2O_3$), samarium oxide ($Sm_2O_3$), terbium oxide ($Tb_2O_3$), thallium oxide ($Tl_2O_3$), thulium oxide ($Tm_2O_3$), yttrium oxide ($Y_2O_3$), ytterbium oxide ($Yb_2O_3$), yttria-stabilized zirconium oxide (YSZ), magnesium oxide (MgO), strontium-titanium oxide ($SrTiO_3$), barium-titanium oxide ($BaTiO_3$), barium-zirconium oxide ($BaZrO_3$), and magnesium-aluminum oxide ($MgAl_2O_4$) The preferred template layer materials include cerium oxide, gadolinium oxide, praseodymium oxide, dysprosium oxide, yttria-stabilized zirconium oxide, magnesium oxide, strontium-titanium oxide, barium-titanium oxide, barium-zirconium oxide, and magnesium-aluminum oxide.

The template layer can be deposited upon the etchable substrate by, e.g., pulsed laser deposition or by methods such as evaporation including coevaporation, e-beam evaporation and activated reactive evaporation, sputtering including magnetron sputtering, ion beam sputtering or ion assisted sputtering, cathodic arc deposition, chemical vapor deposition (CVD), plasma enhanced chemical vapor deposition (PECVD), organometallic chemical vapor deposition (OMCVD), molecular beam epitaxy (MBE), a sol-gel process, and liquid phase epitaxy.

In a pulsed laser deposition, powder of the desired template material, e.g., cerium oxide, can be initially pressed into a disk or pellet under high pressure, generally above about 1000 pounds per square inch (PSI) and the pressed disk then sintered in an oxygen atmosphere at temperatures above about 1000° C. for at least about 1 hour, preferably from about 12 to about 24 hours. An apparatus suitable for the pulsed laser deposition is shown in Appl. Phys. Lett. 56, 578 (1990),"Effects of beam parameters on excimer laser deposition of $YBa_2Cu_3O_{7-x}$", such description hereby incorporated by reference.

Suitable conditions for the pulsed laser deposition include, e.g., the laser, such as an excimer laser (20 nanoseconds (ns), 308 nanometers (nm)), targeted upon a rotating pellet of the template material at an incident angle of about 45°. The target substrate can be mounted upon a heated holder rotated at about 0.5 rpm to minimize thickness variations in the resultant film. The substrate can be heated during the deposition at temperatures from about 600° C. to about 950° C., preferably from about 700° C. to about 850° C. An oxygen atmosphere of about 0.1 millitorr (mTorr) to about 10 Torr, preferably from about 100 to about 250 mTorr, can be maintained within the deposition chamber during the deposition. Distance between the substrate holder and the pellet can be from about 4 centimeters (cm) to about 10 cm. In the case of sapphire as a substrate, the template layers may be deposited at oxygen pressures of about 350 mTorr and temperatures of about 900° C. to promote the formation of (100) oriented template layers.

The rate of the deposited film can be varied from about 0.1 angstrom per second (A/s) to about 200 A/s by changing the laser repetition rate from about 1 hertz (Hz) to about 200 Hz. As laser beam divergence is a function of the repetition rate, the beam profile is monitored after any change of repetition rate and the lens focal distance adjusted to maintain a constant laser energy density upon the target pellet. Generally, the laser beam can have dimensions of about 3 millimeters (mm) by 4 mm with an average energy density of about 1 to 2 joules per square centimeter ($J/cm^2$). After deposition, the films generally are cooled to 200° C. within an oxygen atmosphere of about 100 Torr over about 15 to about 30 minutes.

After coating the etchable substrate with the template material, the template layer can be coated with a layer of a ceramic high temperature superconductive material. Among the suitable ceramic high temperature superconductive materials are those superconductive materials having a critical transition temperature ($T_c$) of greater than about 20 Kelvin (K). Among the materials with such a $T_c$ are included, e.g., yttrium-barium-copper oxide ($YBa_2Cu_3O_{7-x}$), bismuth-strontium-calcium-copper oxide, thallium-barium-calcium-copper oxide, neodymium-cerium-copper oxide and bismuth-potassium-barium oxide (BKBO).

The superconductive layer can be deposited upon the template layer by, e.g., pulsed laser deposition under conditions similar to the deposition of the template layer.

After the template layer is coated with the superconductive material, the layer of superconductive material is coated with a layer of protective material, such protective material capable of protecting the underlying superconductive material during the subsequent etching away of the etchable material, i.e., either the etchable substrate or the etchable layer. Suitable protective materials can generally include polymeric materials such as, e.g., polymethylmethacrylate (PMMA). The protective material must be capable of being removed from the superconductive material after the etchable material is removed. In some cases, the sides of a template material layer will need protection during a subsequent etching stage and a protective material such as a polymeric material may be used to protect the sides of, e.g., cerium oxide, during a hydrofluoric etch of an etchable substrate.

After application of the protective material upon the superconductive material, the etchable substrate or material can be removed. For example, where the etchable substrate is single crystal quartz, the quartz substrate can be removed, e.g., by hydrofluoric acid (HF). Other examples of etchable materials and suitable etchants are well known to those skilled in the art. The resultant film after removal of the etchable substrate or material includes the template layer, the layer of ceramic high temperature superconductive material, and the layer of protective material upon the superconductive material.

Finally, the protective material can be removed from the superconductive material to leave the essentially substrate-free, free-standing superconductive film. The protective material can be removed by, e.g., stripping a protective polymer with a suitable solvent such as acetone.

In another embodiment of the present invention, a superconductive article such as a free-standing bulk form, e.g., a microwave cavity, or a free-standing thin film can be protected from attack from the atmosphere or moisture by coating the superconductive article with a thin layer of an inorganic protective material. Generally, any of the materials previously described as suitable as template materials can be used as the inorganic protective layer, e.g., cerium oxide, curium oxide, dysprosium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, yttrium oxide, ytterbium oxide, yttria-stabilized zirconium oxide, magnesium oxide, strontium-titanium oxide, barium-titanium oxide, barium-zirconium oxide, and magnesium-aluminum oxide.

The present invention is more particularly described in the following examples which are intended as illustrative only, since numerous modifications and variations will be apparent to those skilled in the art.

EXAMPLE 1

A substrate of strontium titanate is coated by pulsed laser deposition with a layer of cerium oxide. A layer of yttria-stabilized zirconia about 1000 angstroms in thickness is then deposited upon the layer of cerium oxide. Onto the layer of yttria-stabilized zirconia is then deposited a layer of superconductive yttrium-barium-copper oxide material (YBCO) about 5000 angstroms in thickness. A layer of a protective polymer, polymethylmethacrylate (PMMA), is then spin coated onto the layer of superconductive material. The layer of cerium oxide is then etched or removed by exposure to hydrofluoric acid whereby a composite structure of yttria-stabilized zirconia/YBCO/PMMA remains. The polymer protective layer is then removed by acetone whereby the resultant article including a 1000 angstrom thick layer of yttria-stabilized zirconia and a 5000 angstrom thick layer of superconductive YBCO remains.

EXAMPLE 2

A substrate of quartz is coated by pulsed laser deposition with a layer of yttria-stabilized zirconia about 1000 angstroms in thickness. Onto the layer of yttria-stabilized zirconia is then deposited a layer of superconductive yttrium-barium-copper oxide material (YBCO) about 5000 angstroms in thickness. A layer of a protective polymer, polymethylmethacrylate (PMMA), is then spin coated onto the layer of superconductive material. The quartz substrate is then etched or removed by exposure to hydrofluoric acid whereby a composite structure of yttria-stabilized zirconia/YBCO/PMMA remains. The polymer protective layer is then removed by acetone whereby the resultant article including a 1000 angstrom thick layer of yttria-stabilized zirconia and a 5000 angstrom thick layer of superconductive YBCO remains.

EXAMPLE 3

A microwave cavity is formed by pressing superconductive powder of YBCO. After the pressing, a layer of cerium oxide about 1000 angstroms in thickness is applied onto the surfaces of the superconductive microwave cavity by pulsed laser deposition.

Although the present invention has been described with reference to specific details, it is not intended that such details should be regarded as limitations upon the scope of the invention, except as and to the extent that they are included in the accompanying claims.

What is claimed is:

1. A free-standing superconducting film consisting essentially of:
    a layer of a template material having a crystal lattice structure capable of promoting epitaxial orientation in a subsequently deposited ceramic high temperature superconducting material, said template material selected from the group consisting of cerium oxide, curium oxide, dysprosium oxide, erbium oxide, europium oxide, iron oxide, gadolinium oxide, holmium oxide, indium oxide, lanthanum oxide, manganese oxide, lutetium oxide, neodymium oxide, praseodymium oxide, plutonium oxide, samarium oxide, terbium oxide, thallium oxide, thulium oxide, yttrium oxide, ytterbium oxide, yttria-stabilized zirconium oxide, magnesium oxide, strontium-titanium oxide, barium-titanium oxide, barium-zirconium oxide, and magnesium-aluminum oxide; and
    a layer of epitaxially oriented ceramic high temperature superconducting material adjacent the layer of the template material, said film further characterized as having a thickness ratio of the superconducting material to the template material of from about 1:10 to about 100:1.

2. The superconducting film of claim 1 wherein the template material is selected from the group consisting of cerium oxide, gadolinium oxide, yttrium oxide, praseodymium oxide and dysprosium oxide.

3. The superconducting film of claim 1 wherein the ceramic high temperature superconducting material is a superconductive material having a $T_c$ of greater than 20 K.

4. The superconducting film of claim 1 wherein the ceramic high temperature superconducting material is yttrium-barium-copper oxide.

5. A free-standing superconducting film consisting essentially of:
    a layer of a template material having chemical and structural compatibility with a subsequently deposited ceramic high temperature superconducting material and a crystal lattice structure capable of promoting epitaxial orientation in the subsequently deposited ceramic high temperature superconducting material; and,
    a layer of epitaxially oriented ceramic high temperature superconducting material adjacent the layer of the template material, said film further characterized as having a thickness ratio of the superconducting material to the template material of from about 1:10 to 100:1.

* * * * *